US012701771B2

(12) United States Patent
Zhang et al.

(10) Patent No.: US 12,701,771 B2
(45) Date of Patent: Aug. 4, 2026

(54) METHOD OF MANUFACTURING A THREE-DIMENSIONALLY INTEGRATED STRUCTURE HAVING A CLAMPING SURFACE AND A WAFER STACK WITH A CHAMFERED SURFACE

(71) Applicant: WUHAN XINXIN SEMICONDUCTOR MANUFACTURING CO., LTD., Wuhan (CN)

(72) Inventors: Anna Zhang, Wuhan (CN); Yu Zhou, Wuhan (CN); Sheng Hu, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 484 days.

(21) Appl. No.: 18/076,909

(22) Filed: Dec. 7, 2022

(65) Prior Publication Data

US 2024/0194531 A1 Jun. 13, 2024

(30) Foreign Application Priority Data

Jul. 27, 2022 (CN) .......................... 202210893231.4

(51) Int. Cl.
*H10D 84/03* (2025.01)
*H10D 88/00* (2026.01)
(Continued)

(52) U.S. Cl.
CPC ........... *H10D 84/038* (2025.01); *H10D 88/01* (2025.01); *H10P 52/00* (2026.01);
(Continued)

(58) Field of Classification Search
CPC ............. H01L 21/0274; H01L 21/3043; H01L 21/0337; H01L 24/11; H01L 24/13;
(Continued)

(56) References Cited

U.S. PATENT DOCUMENTS

| | | | | |
|---|---|---|---|---|
| 5,942,041 A | * | 8/1999 | Lo ........................ | C23C 16/4585 |
| | | | | 438/758 |
| 2002/0064729 A1 | * | 5/2002 | Ching ................. | H01L 21/2885 |
| | | | | 430/311 |

(Continued)

FOREIGN PATENT DOCUMENTS

| | | |
|---|---|---|
| CN | 105990117 A | 10/2016 |
| CN | 108231646 A | 6/2018 |

(Continued)

*Primary Examiner* — Wael M Fahmy
*Assistant Examiner* — Tiberiu Dan Onuta
(74) *Attorney, Agent, or Firm* — MUNCY, GEISSLER, OLDS & LOWE, P.C.

(57) ABSTRACT

A 3D integrated structure and a method for fabricating the structure. In the method, a first trimming process is performed in a peripheral region of a wafer stack to form a chamfered surface adjacent to and surrounding an active device region. As a result, a thickness of the wafer stack along the chamfered surface gradually decreases from an edge of the active device region outward. In this way, a photoresist layer can be subsequently easily applied to cover the junction of the active device region and the chamfered surface, without the formation of discontinuities there, which may affect the subsequent processes. Additionally, in the method, a second trimming process is performed at an edge of the peripheral region to form a clamping surface adjacent to and surrounding the chamfered surface. In this way, it is unnecessary to clamp the wafer stack at a top surface thereof.

7 Claims, 4 Drawing Sheets

(51) Int. Cl.

| | | |
|---|---|---|
| *H10P 52/00* | (2026.01) | |
| *H10P 76/20* | (2026.01) | |
| *H10W 72/00* | (2026.01) | |
| *H10W 72/20* | (2026.01) | |

(52) U.S. Cl.
CPC ..... *H10P 76/2041* (2026.01); *H10W 72/0112* (2026.01); *H10W 72/01235* (2026.01); *H10W 72/242* (2026.01)

(58) Field of Classification Search
CPC ....... H01L 24/742; H01L 24/03; H01L 24/05; H01L 2224/11462; H01L 2224/13023; H01L 2224/742; H01L 2924/40; H10D 84/038; H10D 88/01
See application file for complete search history.

(56) References Cited

U.S. PATENT DOCUMENTS

| | | | |
|---|---|---|---|
| 2005/0014347 A1 | 1/2005 | Tomita et al. | |
| 2008/0151215 A1 | 6/2008 | Soer et al. | |
| 2014/0357089 A1* | 12/2014 | Buckalew .............. | C25D 7/126 |
| | | | 134/198 |
| 2017/0323815 A1* | 11/2017 | Kuenanz ................. | H10P 72/18 |
| 2018/0138164 A1 | 5/2018 | Lee et al. | |
| 2021/0305205 A1* | 9/2021 | Hsieh ...................... | H10P 54/00 |
| 2022/0344150 A1* | 10/2022 | Chang ..................... | H10P 52/00 |

FOREIGN PATENT DOCUMENTS

| | | | |
|---|---|---|---|
| CN | 111968985 A | 11/2020 | |
| CN | 114496727 A | 5/2022 | |
| TW | 200632541 A | 9/2006 | |
| WO | WO2022040052 A1 | 2/2022 | |

* cited by examiner

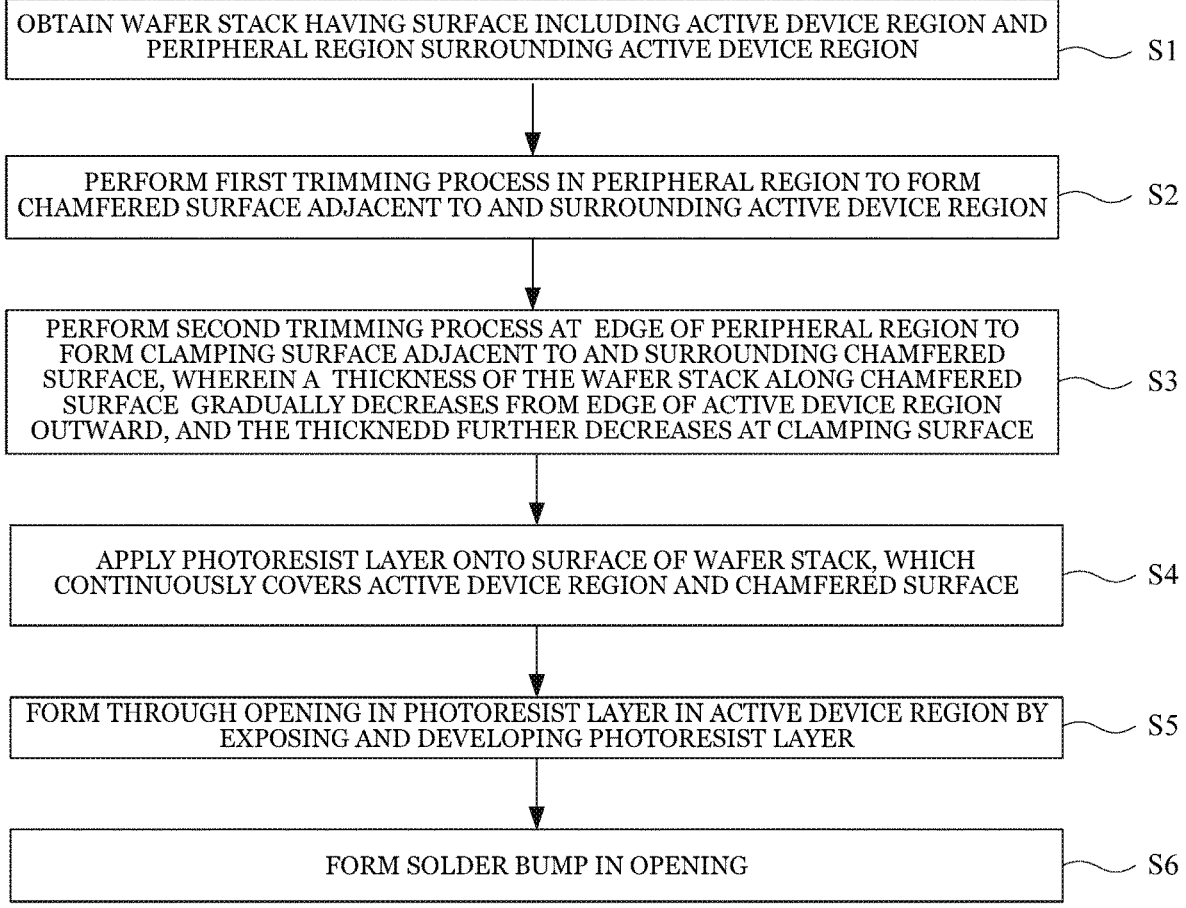

OBTAIN WAFER STACK HAVING SURFACE INCLUDING ACTIVE DEVICE REGION AND PERIPHERAL REGION SURROUNDING ACTIVE DEVICE REGION    S1

PERFORM FIRST TRIMMING PROCESS IN PERIPHERAL REGION TO FORM CHAMFERED SURFACE ADJACENT TO AND SURROUNDING ACTIVE DEVICE REGION    S2

PERFORM SECOND TRIMMING PROCESS AT EDGE OF PERIPHERAL REGION TO FORM CLAMPING SURFACE ADJACENT TO AND SURROUNDING CHAMFERED SURFACE, WHEREIN A THICKNESS OF THE WAFER STACK ALONG CHAMFERED SURFACE GRADUALLY DECREASES FROM EDGE OF ACTIVE DEVICE REGION OUTWARD, AND THE THICKNEDD FURTHER DECREASES AT CLAMPING SURFACE    S3

APPLY PHOTORESIST LAYER ONTO SURFACE OF WAFER STACK, WHICH CONTINUOUSLY COVERS ACTIVE DEVICE REGION AND CHAMFERED SURFACE    S4

FORM THROUGH OPENING IN PHOTORESIST LAYER IN ACTIVE DEVICE REGION BY EXPOSING AND DEVELOPING PHOTORESIST LAYER    S5

FORM SOLDER BUMP IN OPENING    S6

Fig. 3

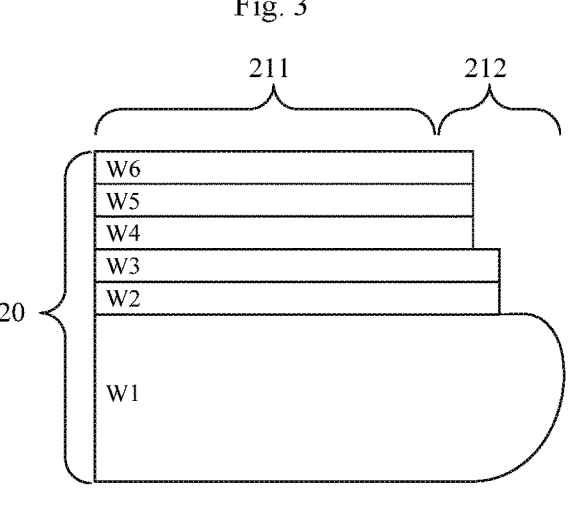

METHOD OF MANUFACTURING A THREE-DIMENSIONALLY INTEGRATED STRUCTURE HAVING A CLAMPING SURFACE AND A WAFER STACK WITH A CHAMFERED SURFACE

CROSS-REFERENCE TO RELATED APPLICATION

This application claims the priority of Chinese patent application number 202210893231.4, filed on Jul. 27, 2022, the entire contents of which are incorporated herein by reference.

TECHNICAL FIELD

The present invention relates to the field of semiconductor technology and, in particular, to a three-dimensionally (3D) integrated structure and a method for fabricating the structure.

BACKGROUND

Three-dimensional (3D) integration can be used to fabricate interconnected high-performance integrated circuits, and is a new technology for producing high-performance chips. In a 3D integrated process, multiple wafers are stacked and interconnected together, and solder bumps for external connection are then fabricated on a surface on one side of the wafer stack. Before the solder bumps are formed, a trimming process is generally performed to remove an edge portion of the wafer stack, the edge portion has a certain depth (i.e., a trimming depth) and a certain width (i.e., a trimming width). This portion typically exhibits poor bonding quality, and its removal can improve edge integrity and smoothness, and reduce edge stress, of the wafer stack.

Following the trimming process, photoresist is coated on the wafer surface and solder bumps are formed at predetermined locations not covered by the photoresist. However, as shown in FIG. 1, in a conventional process, as a result of trimming, a steep and deep step may be formed at an edge of a wafer stack 10. In this case, it would be difficult for photoresist PR to pile up high enough to cover a corner edge portion of the step (indicated by the dotted circle in FIG. 1). Consequently, during the formation of solder bumps 11 at intended locations not covered by the photoresist, additional undesired solder bumps will also be formed around the corner, which may affect the subsequent process. In FIG. 1, 12 denote a clamp.

In order to avoid the formation of undesired solder bumps 11 at the edge of the wafer stack 10, as shown in FIG. 2, in an alternative conventional process, during the formation of the solder bumps 11 at the intended locations not covered by the photoresist, the clamp 12 clamps the wafer stack 10 at a top surface thereof. However, with the development of technology, more and more wafers are stacked together, necessitating increasing trimming widths and depths. In this context, the approach shown in FIG. 2 would become less desirable because it tends to cause damage to the top surface of the wafer stack 10, which may affect structures formed in an active device region and an area of the active device region.

SUMMARY OF THE INVENTION

In order to prevent the formation of additional undesired structures (e.g., solder bumps) at an edge of a wafer stack while not affecting structures formed in an active device region and an area of the active device region, the present invention provides a 3D integrated structure and a method for fabricating the same.

In one aspect, the present invention provides a method for fabricating a 3D integrated structure, which comprises:

obtaining a wafer stack having a surface that includes an active device region and a peripheral region surrounding the active device region;

forming a chamfered surface adjacent to and surrounding the active device region by performing a first trimming process in the peripheral region; and forming a clamping surface adjacent to and surrounding the chamfered surface by performing a second trimming process at an edge of the peripheral region, wherein a thickness of the wafer stack along the chamfered surface gradually decreases from an edge of the active device region outward, and the thickness further decreases at the clamping surface.

Optionally, the chamfered surface may comprise at least one of an inclined surface and a curved surface.

Optionally, the method may further comprise, after the formation of the clamping surface:

applying a photoresist layer onto the surface of the wafer stack, wherein the photoresist layer continuously covers the active device region and the chamfered surface;

forming a through opening in the photoresist layer in the active device region by exposing and developing the photoresist layer; and forming a solder bump in the through opening.

Optionally, the solder bump may be formed in the through opening by an electroplating process in which the wafer stack is clamped at the clamping surface by a clamp.

Optionally, a height difference between an 1 edge of the chamfered surface and the clamping surface is smaller than a thickness of the photoresist layer. Optionally, the height difference may be greater than 0, and smaller than or equal to 60 μm.

In another aspect, the present invention provides a 3D integrated structure comprising a wafer stack having a surface, wherein the wafer stack has an active device region and a peripheral region surrounding the active device region, wherein the peripheral region is provided with a chamfered surface adjacent to and surrounding the active device region and a clamping surface adjacent to and surrounding the chamfered surface, wherein a thickness of the wafer along the chamfered surface gradually decreases from an edge of the active device region outward, and the thickness further decreases at the clamping surface.

Optionally, the wafer stack may comprise at least one solder bump arranged in the active device region.

Optionally, the wafer stack may comprise at least three wafers stacked in a thickness direction.

Optionally, the clamping surface may have a width ranging from 3 mm to 5 mm.

Optionally, a height difference between an edge of the chamfered surface and the clamping surface is greater than 0, and smaller than or equal to 60 μm.

In the method of the present invention, the chamfered surface adjacent to and surrounding the active device region is formed by the first trimming process performed in the peripheral region, the thickness of the wafer stack along the chamfered surface gradually decreases from the edge of the active device region outward, the photoresist layer can be subsequently easily applied to cover the junction of the active device region and the chamfered surface, without the formation of discontinuities there, which may affect the subsequent processes. Additionally, in order to enable the wafer stack to be securely held in the subsequent processes and during transportation, the clamping surface adjacent to and surrounding the chamfered surface is further formed by performing the second trimming process at the edge of the peripheral region in the method. In this way, it is unnecessary to clamp the wafer stack at the top surface. This can avoid the clamp from causing damage to the top surface of the wafer stack, which may adversely affect structures formed in the active device region and an area of active device region, and therefore helps meet the process requirements.

In the 3D integrated structure of the present invention, the peripheral region is provided with the chamfered surface adjacent to and surrounding the active device region and the clamping surface adjacent to and surrounding the chamfered surface. During the formation of the sold bump(s) or another process requiring the portion external to the active device region to be covered, the junction of the active device region and the chamfered surface can be easily covered, avoiding the formation of unwanted structures (e.g., solder bumps) external to the active device region due to discontinuities in the photoresist layer. Moreover, the clamping surface enables the wafer stack to be securely held while avoiding a clamp from damaging the top surface of the wafer stack, which may adversely affect structures formed in the active device region and an area of the active device region. Thus, this helps improve the quality of the 3D integrated structure.

BRIEF DESCRIPTION OF THE DRAWINGS

FIG. 3 is a flowchart of a method for fabricating a 3D integrated structure according to an embodiment of the present invention.

FIGS. 4A to 4E are schematic cross-sectional views of structures formed in steps in the method for fabricating a 3D integrated structure according to an embodiment of the present invention.

DESCRIPTION OF REFERENCE NUMERALS IN THE DRAWINGS

Figures 1, 2:
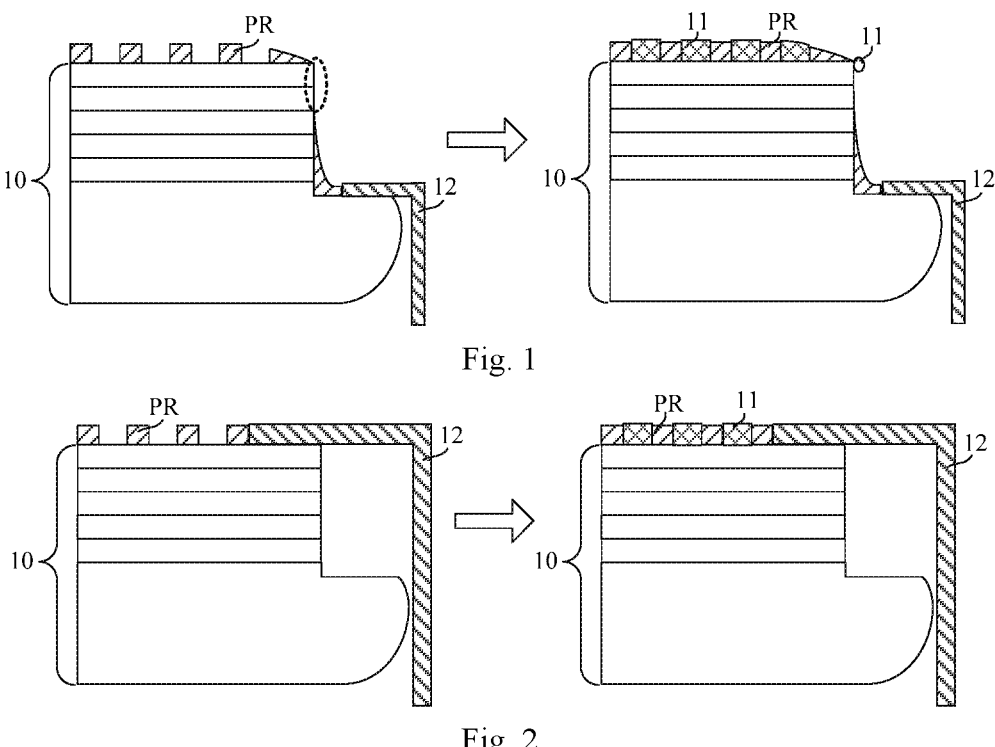
FIG. 1 is a schematic cross-sectional view of a structure formed as a result of forming a photoresist layer over a trimmed wafer stack and then solder bumps in openings in the photoresist layer in a conventional process.
FIG. 2 is a schematic cross-sectional view of a structure formed as a result of forming a photoresist layer over a trimmed wafer stack and then solder bumps in openings in the photoresist layer in another conventional process.

10, 20—Wafer Stack; 11, 22—Solder Bump; 12, 30—Clamp; 211—Active Device Region; 212—Peripheral Region; 212a—Chamfered Surface; 212b—Clamping Surface; 21—Photoresist Layer; 21a—Opening; 22—Solder Bump.

DETAILED DESCRIPTION

Particular embodiments of the present invention will be described in greater detail below with reference to the accompanying drawings. From the following description, advantages and features of the invention will become more apparent. It is to be understood that the figures are provided in a very simplified form not necessarily drawn to exact scale for the only purpose of facilitating easy and clear description of the embodiments.

It is to be noted that, the terms "first", "second" and the like may be used hereinafter to distinguish between similar elements without necessarily implying any particular ordinal or chronological sequence. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

Referring to FIG. 3, in embodiments of the present invention, there is provided a method for fabricating a 3D integrated structure, which includes:

S1: obtaining a wafer stack having a surface including an active device region and a peripheral region surrounding the active device region;

S2: performing a first trimming process in the peripheral region to form a chamfered surface adjacent to and surrounding the active device region;

S3: performing a second trimming process at an edge of the peripheral region to form a clamping surface adjacent to and surrounding the chamfered surface, wherein a thickness of the wafer stack along the chamfered surface gradually decreases from an edge of the active device region outward, and the thickness further decreases at the clamping surface;

S4: applying a photoresist layer onto the surface of the wafer stack, which continuously covers the active device region and the chamfered surface;

S5: forming through openings in the photoresist layer in the active device region by exposing and developing the photoresist layer; and S6: forming solder bumps in the through openings.

The method of FIG. 3 will be further described below with reference to FIGS. 4A to 4E.

FIG. 4A is a schematic cross-sectional view of the wafer stack before the first trimming process is performed, according to an embodiment of the present invention. Referring to FIG. 4A, the wafer stack 20 obtained in step S1 includes at least two wafers stacked together, which are all silicon wafers, for example. The wafer stack 20 may include at least three (e.g., five or six) wafers, which are stacked one above another in the thickness direction. In one embodiment, the wafer stack 20 may include up to ten or more wafers. The wafer stacks 20 may be obtained by a known process. For example, semiconductor processes may be first performed on a first wafer W1 to form thereon devices and/or circuits required by the design, and a second wafer W2 that have undergone semiconductor processes may be then bonded and electrically connected to the first wafer W1. Subsequently, a third wafer W3 that have undergone semiconductor processes may be optionally bonded to the side of the first wafer W1 away from the second wafer W2 or to the side of the second wafer W2 away from first wafer W1. Afterwards, a fourth wafer W4, a fifth wafer W5, a sixth wafer W6, optionally, as well as one or more additional wafers may be optionally stacked and electrically interconnected in a similar way, thereby resulting in the formation of the wafer stack 20. During the formation of the wafer stack 20, as necessary, at least some of the wafers may be subjected to an edge trimming process.

In the embodiment shown in FIG. 4A, the wafer stack 20 includes, for example, six wafers that are stacked and electrically interconnected together. On a top surface of the wafer stack 20, input/output (I/O) terminals (or solder pads, not shown) of circuits are formed. Subsequently, solder bumps for connection to external circuits may be formed on said surface. Here, the surface to be trimmed is, for example, the surface formed thereon with the I/O terminals.

Specifically, the surface of the wafer stack includes the active device region 211 and the peripheral region 212 surrounding the active device region 211 (in FIGS. 4A to 4E, only a part of the active device region 211 and a part of the peripheral region 212 located on one side of the active device region 211 are shown). Devices and/or circuits useful to the 3D stacked chip are provided in the active device region 211. In order to avoid affecting the devices and/or circuits in the active device region 211, the trimming processes are performed only in the peripheral region 212 but not in the active device region 211. The peripheral region 212 surrounds the active device region 211 and may have a width of, for example, 6 mm to 10 mm. It is to be understood that the active device region 211 and peripheral region 212 are shown in a schematic manner and not drawn to scale.

Figure 4B:
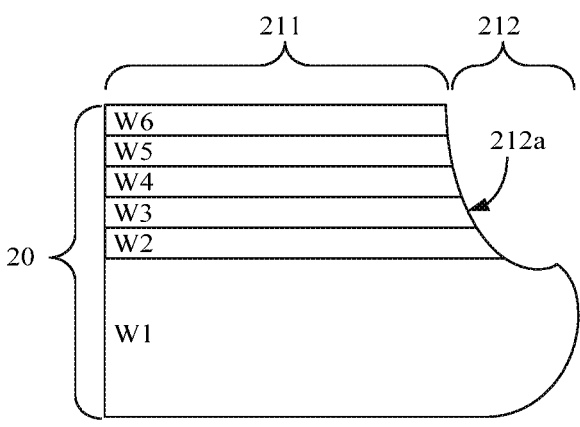

FIG. 4B is a schematic cross-sectional view of the wafer stack after the chamfered surface is formed around an edge thereof according to an embodiment of the present invention. Referring to FIG. 4B, in step S2, the first trimming process is performed in the peripheral region 212 to form the chamfered surface 212a adjacent to and surrounding the active device region 211.

The chamfered surface 212a may be formed by configuring a trimming apparatus so that it grinds and trims the edge of the wafer stack 20 at an angle. As a result of the formation of the chamfered surface 212a, the thickness of the wafer stack 20 gradually decreases from the edge of the active device region 211 outward. In the subsequent step, the photoresist layer can be easily applied so as to cover the junction of the active device region 211 and the chamfered surface 212a, thus helping avoid the formation of unwanted structures (e.g., solder bumps) external to the active device region 211, which may affect the subsequent processes. The chamfered surface 212a may include at least one of an inclined surface and a curved surface. In this embodiment, the chamfered surface 212a is a curved surface, for example. As can be seen from the longitudinal cross-sectional view of FIG. 4B, the curved surface may include at least one curved sections.

Figure 4C:
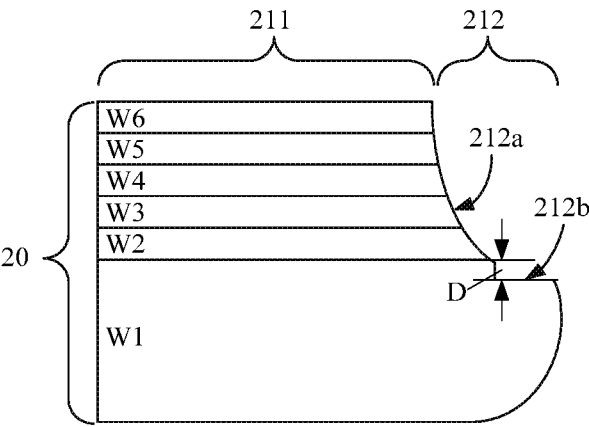

FIG. 4C is a schematic cross-sectional view of the wafer stack after the clamping surface is formed around an edge thereof according to an embodiment of the present invention. Referring to FIG. 4C, in step S3, the second trimming process is performed at the edge of the peripheral region to form the clamping surface 212b adjacent to and surrounding the chamfered surface 212a. As a result, in the direction away from the active device region 211, the thickness of the wafer stack 20 along the chamfered surface 212a gradually decreases away from the active device region 211 and the thickness further decreases at the clamping surface 212b. The wafer stack 20 may be clamped at the clamping surface 212b. The clamping surface 212b may have a width of, for example, 3 mm to 5 mm.

In this embodiment, the wafer stack is ground at different angles in the second and first trimming processes. The second trimming process on the edge of the peripheral region 212 may proceeds, for example, in the thickness direction of the wafer stack 20 so that the clamping surface 212b is a flat surface compared with the chamfered surface 212a, which can facilitate clamping by a clamp. In the second trimming process, a portion of the chamfered surface

212a proximal to the edge of the peripheral region 212 may be ground and flattened to form a part of the clamping surface 212b. As a result of the second trimming process, there is a height difference D between an edge of the chamfered surface 212a and the clamping surface 212b.

Figure 4D:
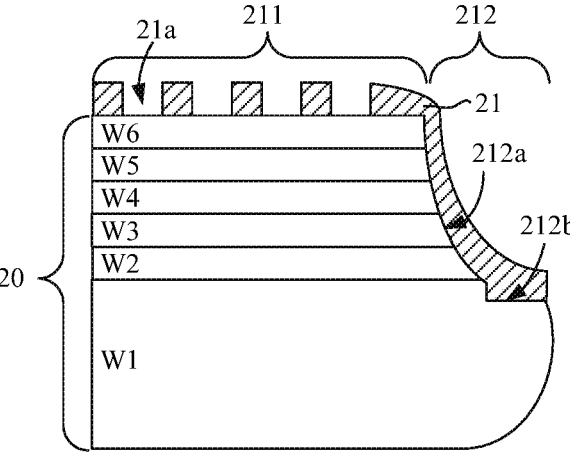

FIG. 4D is a schematic cross-sectional view of the wafer stack after the patterned photoresist layer is performed on the surface of the wafer stack according to an embodiment of the present invention. Referring to FIG. 4D, subsequent to the formation of the chamfered surface 212a and the clamping surface 212b, in this embodiment, the photoresist layer 21 is formed on the surface of the wafer stack 20 in step S4. The photoresist layer 21 continuously covers the active device region 211, the chamfered surface 212a and, optionally, the clamping surface 212b. After that, the photoresist layer 21 is exposed and developed in step S5 so that the through openings 21a are formed in the photoresist layer 21 in the active device region 211.

Specifically, the openings 21a formed as a result of the exposure and development of the photoresist layer 21 may be aligned with the respective I/O terminals on the surface of the wafer stack 20. In order to prevent discontinuities of the applied photoresist layer 21 at the corner where the chamfered surface 212a is joined to the clamping surface 212b, which may lead to the formation of additional unwanted solder bumps, preferably, the height difference D between the edge of the chamfered surface 212a and the clamping surface 212b is smaller than a thickness of the photoresist layer 21. For example, the height difference D may be greater than 0 and smaller than or equal to 60 μm. The height difference D may be smaller than 30 μm.

Figure 4E:
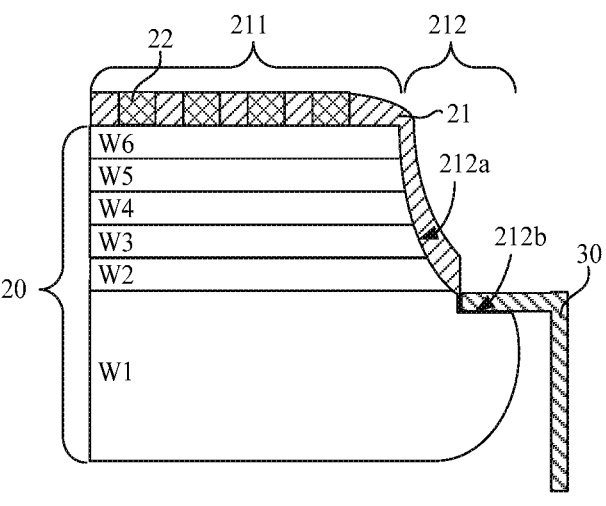

FIG. 4E is a schematic cross-sectional view of the wafer stack after the solder bumps are formed on the surface thereof according to an embodiment of the present invention. Referring to FIG. 4E, in step S6, the solder bumps 22 are formed in the openings 21a in the photoresist layer 21. The formation of the solder bumps 22 in the openings 21a may be accomplished by an electroplating process. As an example, a seed layer (e.g., a Ti/Cu layer) may be first formed in the openings 21a in the photoresist layer 21, and the wafer stack 20 may be then clamped by a clamp 30 and placed into an electroplating bath for electroplating. The clamping by the clamp 30 may occur at the clamping surface 212b (before the clamping, the photoresist on the clamping surface 212b may be at least partially removed). The solder bump 22 may include at least one of tin, lead-tin alloy, tin-silver alloy and tin-silver-copper alloy. After the formation of the solder bumps 22, the photoresist layer 21 may be removed, and a thermal reflow process may be performed to process the solder bumps 22 into solder balls.

In the method for fabricating a 3D integrated structure of this embodiment, the chamfered surface 212a adjacent to and surrounding the active device region 211 is formed by the first trimming process performed in the peripheral region 212. A thickness of the wafer stack 20 along the chamfered surface 212a gradually decreases from the edge of the active device region 211 outward, so that the photoresist layer 21 can be subsequently easily applied to cover the junction of the active device region 211 and the chamfered surface 212a, without the formation of discontinuities there, which may lead to the subsequent formation of unwanted structures (e.g., solder bump) external to the active device region 211 that may affect the subsequent processes. Additionally, in order to enable the wafer stack 20 to be securely held in the subsequent processes and during transportation, the clamping surface 212b adjacent to and surrounding the chamfered surface 212a is further formed by performing the second trimming process at the edge of the peripheral region 212. In this way, the wafer stack 20 can be clamped at the clamping surface 212b rather than at the top surface. This can avoid the clamp from causing damage to the top surface of the wafer stack 20, which may adversely affect structures formed in an active device region and an area of the active device region, and therefore helps meet the process requirements.

Embodiments of the present invention also relate to a 3D integrated structure, which can be fabricated by the above method. The 3D integrated structure includes a wafer stack 20, which may include at least three wafers stacked one above another in the thickness direction. For example, five or six wafers may be included. In one embodiment, the wafer stack 20 may include up to ten or more wafers.

Referring to FIG. 4E, the wafer stack 20 has a surface including an active device region 211 and a peripheral region 212 surrounding the active device region 211. A chamfered surface 212a is formed in the peripheral region 212 so as to be adjacent to and surround the active device region 211. A thickness of the wafer stack 20 along the chamfered surface 212a gradually decreases from an edge of the active device region 211 outward.

A clamping surface 212b adjacent to and surrounding the chamfered surface 212a is also formed in the peripheral region 212. In addition to the gradual decrease along the chamfered surface 212a from the edge of the active device region 211 outward, the thickness of the wafer stack 20 additionally decreases at the clamping surface 212b. The clamping surface may have a width of, for example, 3 mm to 5 mm. There is a height difference D between the clamping surface 212b and an edge of the chamfered surface 212a, which may be, for example, greater than 0 and smaller than 60 μm. Additionally, the height difference D may be smaller than 30 μm. The wafer stack 20 may further include at least one solder bump 22 disposed in the active device region 211.

In the fabrication of the 3D integrated structure according to the present invention, during the formation of the sold bump(s) or another process requiring the portion external to the active device region 211 to be covered, the junction of the active device region 211 and the chamfered surface 212a can be easily covered, avoiding the formation of unwanted structures (e.g., solder bumps 22) external to the active device region 211. Moreover, the clamping surface enables the wafer stack to be securely held while avoiding a clamp from damaging a top surface of the wafer stack, which may adversely affect structures formed in the active device region and an area of the active device region. Thus, this helps improve the quality of the 3D integrated structure.

It is to be noted that the embodiments disclosed herein are described in a progressive manner, with the description of each embodiment focusing on its differences from others. Reference can be made between the embodiments for their identical or similar parts.

The foregoing description is merely that of several preferred embodiments of the present invention and is not intended to limit the scope of the claims of the invention in any way. Any person of skill in the art may make various possible variations and changes to the disclosed embodiments in light of the methodologies and teachings disclosed hereinabove, without departing from the spirit and scope of the invention. Accordingly, any and all such simple variations, equivalent alternatives and modifications made to the foregoing embodiments based on the essence of the present invention without departing from the scope of the embodiments are intended to fall within the scope of protection of the invention.

What is claimed is:

1. A method for fabricating a three-dimensionally integrated structure, comprising:

obtaining a wafer stack having a surface that includes an active device region and a peripheral region surrounding the active device region, wherein the wafer stack comprises at least three wafers;

forming a chamfered surface adjacent to and surrounding the active device region by performing a first trimming process in the peripheral region, wherein each wafer of the wafer stack comprises a sub-chamfered surface, wherein the sub-chamfered surface is a curved surface without angular transition, thereby allowing a smooth transition at an interface between the sub-chamfered surfaces of adjacent wafers; and forming a clamping surface by performing a second trimming process at an edge of the peripheral region, wherein the clamping surface is for clamping the wafer stack and is adjacent to and surrounds the chamfered surface, wherein a thickness of the wafer stack along the chamfered surface gradually decreases from an edge of the active device region outward, and the thickness further decreases at the clamping surface.

2. The method of claim 1, wherein the curved surface is continuously differentiable.

3. The method of claim 1, wherein the clamping surface is a L-shaped clamping surface.

4. The method of claim 1, further comprising, after the formation of the clamping surface:

applying a photoresist layer onto the surface of the wafer stack, wherein the photoresist layer continuously covers the active device region and the chamfered surface;

forming a through opening in the photoresist layer in the active device region by exposing and developing the photoresist layer; and forming a solder bump in the through opening.

5. The method of claim 4, wherein the solder bump is formed in the through opening by an electroplating process in which the wafer stack is clamped at the clamping surface by a clamp.

6. The method of claim 4, wherein a height difference between an edge of the chamfered surface and the clamping surface is smaller than a thickness of the photoresist layer.

7. The method of claim 6, wherein the height difference is greater than 0, and smaller than or equal to 60 μm.

* * * * *